US006840061B1

(12) United States Patent
Hurst et al.

(10) Patent No.: US 6,840,061 B1
(45) Date of Patent: Jan. 11, 2005

(54) COATINGS ON SUBSTRATES

(75) Inventors: Simon James Hurst, Runcorn (GB); Johannes Andreas Maria Ammerlaan, Eindhoven (NL); Richard Joseph McCurdy, Aurora, IL (US)

(73) Assignees: Libbey-Owens-Ford Co., Toledo, OH (US); Pilkington PLC, Merseyside (GB)

( * ) Notice: Subject to any disclaimer, the term of this patent is extended or adjusted under 35 U.S.C. 154(b) by 91 days.

(21) Appl. No.: 09/587,970

(22) Filed: Jun. 6, 2000

(30) Foreign Application Priority Data

Jun. 8, 1999  (GB) .............................................. 9913315

(51) Int. Cl.$^7$ ............................................. C03C 17/245
(52) U.S. Cl. ........................ 65/60.51; 65/60.5; 65/99.1; 65/99.4
(58) Field of Search ............................. 65/60.5, 60.51, 65/60.52, 60.53, 99.1, 99.4

(56) References Cited

U.S. PATENT DOCUMENTS

| 4,123,244 A | * 10/1978 | Leclercq et al. ............ 118/305 |
| 4,329,379 A | 5/1982 | Terneu et al. |
| 4,351,267 A | 9/1982 | Kalbskopf et al. |
| 4,751,149 A | 6/1988 | Vijayakumar et al. |
| 4,878,934 A | 11/1989 | Thomas et al. |
| 4,971,843 A | 11/1990 | Michelotti et al. |
| 4,997,576 A | 3/1991 | Heller et al. |
| 5,041,150 A | 8/1991 | Grundy et al. |
| 5,194,161 A | 3/1993 | Heller et al. |
| 5,256,616 A | 10/1993 | Heller et al. |
| 5,308,458 A | 5/1994 | Urwin et al. |
| 5,393,593 A | 2/1995 | Gulotta et al. |
| 5,505,989 A | 4/1996 | Jenkinson |
| 5,580,364 A | 12/1996 | Goodman et al. |
| 5,853,866 A | 12/1998 | Watanabe et al. |
| 5,939,194 A | 8/1999 | Hashimoto et al. |
| 6,013,372 A | 1/2000 | Hayakawa et al. |
| 6,027,766 A | 2/2000 | Greenberg et al. |
| 6,027,797 A | 2/2000 | Watanabe et al. |
| 6,037,289 A | 3/2000 | Chopin et al. |
| 6,054,227 A | 4/2000 | Greenberg et al. |
| 6,090,489 A | 7/2000 | Hayakawa et al. |
| 6,110,528 A | * 8/2000 | Kimura et al. .............. 427/218 |

FOREIGN PATENT DOCUMENTS

| EP | 684075 A1 | 6/1995 |
| EP | 737513 A1 | 10/1996 |
| EP | 0901991 A2 | 3/1999 |
| GB | 2150044 | 6/1978 |
| GB | 1523991 | 9/1978 |
| GB | 1524326 | 9/1978 |

(List continued on next page.)

OTHER PUBLICATIONS

Journal of Materials Science Letters 9 (1990) 316–319, Kamata et al.; "Rapid Formation of TiO$_2$ Films By A Conventional CVD Method" no month available.

(List continued on next page.)

*Primary Examiner*—Sean Vincent
(74) *Attorney, Agent, or Firm*—Marshall & Melhorn, LLC

(57) ABSTRACT

A process for the production of a photocatalytically active self-cleaning coated substrate, especially a glass substrate, which comprises depositing a titanium oxide coating on the surface of the substrate by contacting it with a fluid mixture containing a source of titanium and a source of oxygen, the substrate being at a temperature of at least 600° C. The coated surface has good durability, a high photocatalytic activity and a low visible light reflection. Most preferably the deposition temperature is in the range 645° C. to 7200° C. which provides especially good durability. The fluid mixture preferably contains titanium chloride and an ester, especially ethyl acetate. Also disclosed is a self cleaning coated substrate, especially a glass substrate, having high photocatalytic activity and low visible light reflection and a durable self-cleaning coated glass.

11 Claims, 2 Drawing Sheets

FOREIGN PATENT DOCUMENTS

| | | |
|---|---|---|
| GB | 1510587 | 10/1978 |
| JP | 63-100042 A | 5/1988 |
| WO | WO 97/07069 A1 | 2/1997 |
| WO | WO 97/97069 | 2/1997 |
| WO | WO 97/10186 | 3/1997 |
| WO | WO 98/06675 A1 | 2/1998 |
| WO | WO 98/41480 | 9/1998 |
| WO | WO 98/41480 A1 | 9/1998 |

OTHER PUBLICATIONS

Photocatalytic Activity of TiO2 Thin Film Under Room Light (in Photocatalytic Purification and Treatment of Water and Air; eds. D.F. Ollis and H, Al–Ekabi, p. 747 (1993), no month available.

Hass, Georg; Thun, Rudolf E., Ed.; *Physics of Thin Films;* vol. 5 Academic Press, New York, 1969, p. 237, pp. 304–306, no month available.

Pierson, Hugh O.; *Handbook of Chemical Vapor Deposition (CVD);* Noyes Publications, Park Ridge, NJ, 1992, pp. 231–237, no month available.

Takashi, Manasari et al.; "PT–TIO2 Thin Films on Glass Substrates as Efficient Photcatalysts"; J. Mat. Sci., 24 (1989) 243, no month available.

Fukayama, S. etal.; "Highly Tranparent and Photoactive TIO2 Thin Film Coated on Glass Substrate"; 187th Electochemical Society Meeting, Abstract No. 735, Extened Abstracts 95–1 (Available at Least by Mar. 1995).

Weinberger, B.R. et al.; "Titanium Dioxide Photocatalysts Produced by Reactive Magnetron Sputtering"; Appl. Phys. Lett. 66 (1995) 2409, no month available.

Kiernan, Vincent; "A Clearer View for Car Drivers"; New Scientist, Aug. 26, 1995, p. 19.

Paz, Y; Luo, A.; "Photooxideative Self–Cleaning Transparent Titanium Dioxide Films on Glass"; J. Mater.Res., 10 (Nov. 1995) 2482.

* cited by examiner

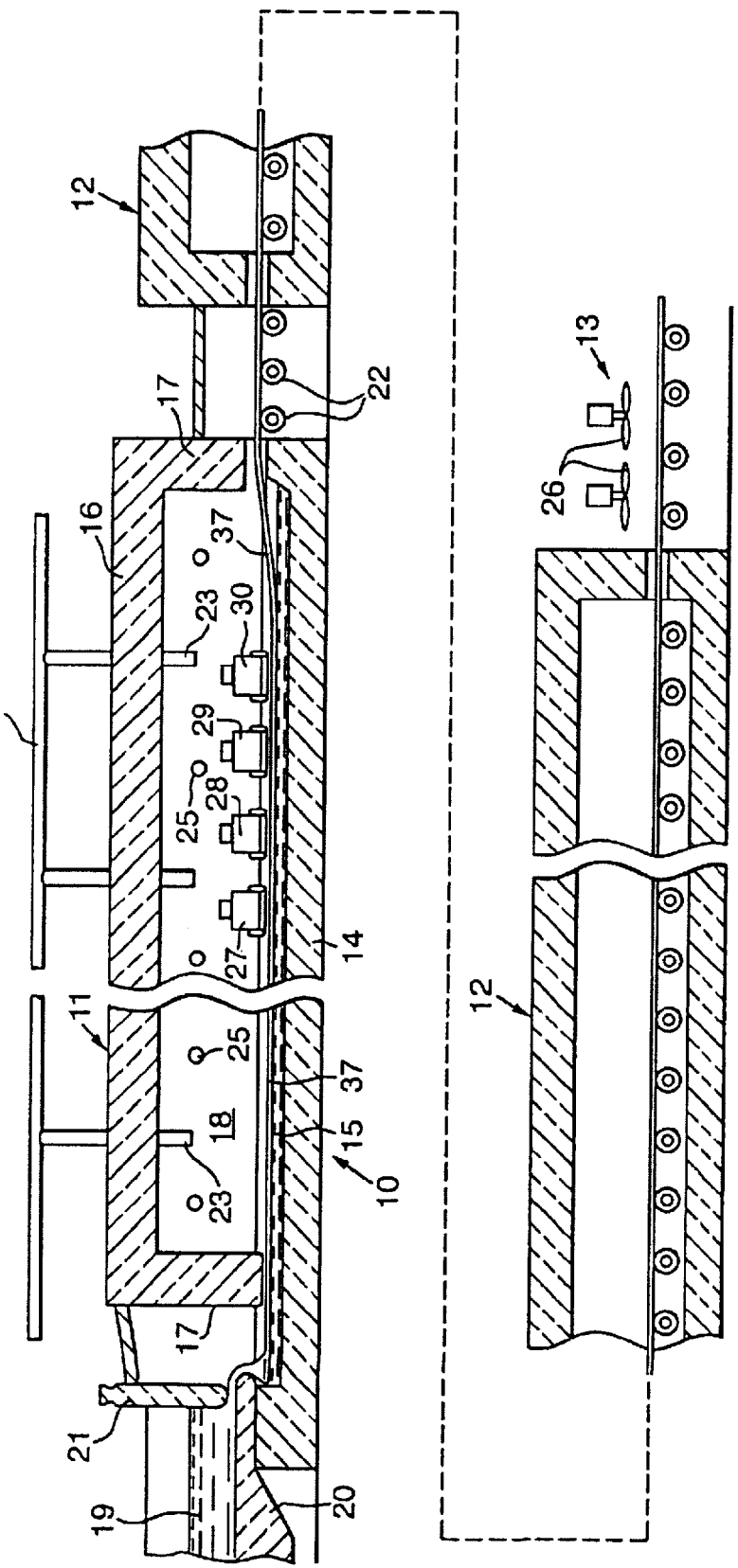

COATINGS ON SUBSTRATES

BACKGROUND OF THE INVENTION

This invention relates to a process for producing photocatalytically active coated substrates, in particular, but not exclusively, it relates to a process for producing photocatalytically active coated glass and such coated glass.

It is known to deposit thin coatings having one or more layers, with a variety of properties, on to substrates including on to glass substrates. One property of interest is photocatalytic activity which arises by the photogeneration, in a semiconductor, of a hole-electron pair when the semiconductor is illuminated by light of a particular frequency. The hole-electron pair can be generated in sunlight and can react in humid air to form hydroxy and peroxy radicals on the surface of the semiconductor. The radicals oxidise organic grime on the surface. This property has an application in self-cleaning substrates, especially in self-cleaning glass for windows.

Titanium dioxide may be an efficient photocatalyst and may be deposited on to substrates to form a transparent coating with photocatalytic self-cleaning properties. Titanium oxide photocatalytic coatings are disclosed in EP 0 901 991 A2, WO 97/07069, WO 97/10186, WO 98/41480, in Abstract 735 of 187th Electrochemical Society Meeting (Reno, Nev., 95-1, p.1102) and in New Scientist magazine (26 Aug. 1995, p.19). In WO 98/06675 a chemical vapour deposition process is described for depositing titanium oxide coatings on hot flat glass at high deposition rate using a precursor gas mixture of titanium chloride and an organic compound as source of oxygen for formation of the titanium oxide coating.

It has been thought that relatively thick titanium oxide coatings need to be deposited to provide good photocatalytic activity. For example, in WO 98/41480 it is stated that a photocatalytically active self-cleaning coating must be sufficiently thick so as to provide an acceptable level of activity and it is preferred that such a coating is at least about 200 Å and more preferably at least about 500 Å thick (the measured thickness of the titanium oxide coatings produced in the Examples all being in the range 400 Å to 2100 Å).

However, a problem of relatively thick titanium oxide coatings is high visible light reflection and thus relatively low visible light transmission. This problem is recognised in the article in New Scientist magazine in relation to coated windscreens, where it is suggested that to reduce the effect of high reflection, dashboards might have to be coated in black velvet or some other material that does not reflect light into a coated windscreen.

EP 0 901 991A2 referred to above, relates to photocatalytic glass panes with a coating of titanium oxide of a particular crystal structure characterised by the presence of particular peaks in its X-ray diffraction pattern. The specification contemplates a range of coating thickness (with the specific Examples all having thickness in the range 20 nm to 135 nm, the thinner coatings being less photocatalytically active than the thicker coatings). The specification also contemplates a range of deposition temperatures from as low as 300° C. to as high as 750° C., but prefers temperatures in the range 400° C. to 600° C., and in all the specific Examples of the invention the titanium dioxide layer is deposited at a temperature in or below this preferred range.

The applicants have now found that by depositing the titanium oxide coatings at higher temperatures, especially temperatures above 600° C., they are able to achieve coatings with an enhanced photocatalytic activity for a given thickness, enabling the same photocatalytic performance to be achieved with thinner coatings. Such thinner coatings tend to have, advantageously, lower visible light reflection and, apparently in consequence of their higher deposition temperature, improved durability, especially to abrasion and temperature cycling in a humid atmosphere.

SUMMARY OF THE INVENTION

The present invention accordingly provides a process for the production of a photocatalytically active coated substrate which comprises depositing a titanium oxide coating on the surface of a substrate by contacting the surface of the substrate with a fluid mixture containing a source of titanium and a source of oxygen, said substrate being at a temperature of at least 600° C., whereby the coated surface of the substrate has a photocatalytic activity of greater than $5 \times 10^{-3}$ $cm^{-1}$ $min^{-1}$ and a visible light reflection measured on the coated side of 35% or lower.

Preferably, the substrate is at a temperature in the range 625° C. to 720° C., more preferably the substrate is at a temperature in the range 645° C. to 720° C.

Advantageously, the fluid mixture comprises titanium chloride as the source of titanium and an ester other than a methyl ester. Thus, in a preferred embodiment, the present invention provides a process for the production of a photocatalytically active coated substrate which comprises depositing a titanium oxide coating having a thickness of less than 40 nm on a substrate by contacting a surface of the substrate with a fluid mixture comprising titanium chloride and an ester other than a methyl ester.

The process may be performed wherein the surface of the substrate is contacted with the fluid mixture when the substrate is at a temperature in the range 600° C. to 750° C.

Preferably, the ester is an alkyl ester having an alkyl group with a β hydrogen (the alkyl group of an alkyl ester is the group derived from the alcohol in synthesis of an ester and a β hydrogen is a hydrogen bonded to a carbon atom β to the oxygen of the ether linkage in an ester). Preferably the ester is a carboxylate ester.

Suitable esters may be alkyl esters having a $C_2$ to $C_{10}$ alkyl group, but preferably the ester is an alkyl ester having a $C_2$ to $C_4$ alkyl group.

Preferably, the ester is a compound of formula: R—C(O)—O—C(X)(X')—C(Y)(Y')—R', where R and R' represent hydrogen or an alkyl group, X, X', Y and Y' represent monovalent substituents, preferably alkyl groups or hydrogen atoms and wherein at least one of Y and Y' represents hydrogen.

Suitable esters that may be used in the process of the present invention include: ethyl formate, ethyl acetate, ethyl propionate, ethyl butyrate, n-propyl formate, n-propyl acetate, n-propyl propionate, n-propyl butyrate, isopropyl formate, isopropyl acetate, isopropyl propionate, isopropyl butyrate, n-butyl formate, n-butyl acetate and t-butyl acetate.

Preferably, the ester comprises an ethyl ester, more preferably the ester comprises ethyl formate, ethyl acetate or ethyl propionate. Most preferably the ester comprises ethyl acetate.

The fluid mixture may be in the form of a liquid, especially dispersed as a fine spray (a process often referred to as spray deposition), but preferably the fluid mixture is a gaseous mixture. A deposition process performed using a gaseous mixture as precursor is often referred to as chemical vapour deposition (CVD). The preferred form of CVD is laminar flow CVD, although turbulent flow CVD may also be used.

The process may be performed on substrates of various dimensions including on sheet substrates, especially on cut sheets of glass, or preferably on-line during the float glass production process on a continuous ribbon of glass. Thus, preferably, the process is performed on-line during the float glass production process and the substrate is a glass ribbon. If the process is performed on line, it is preferably performed on the glass ribbon whilst it is in the float bath.

An advantage of performing the process on-line is that coatings deposited on-line tend to be durable and in particular to have good abrasion and chemical resistance.

An on-line deposition process is preferably, and other deposition processes may be, performed at substantially atmospheric pressure.

In a particularly preferred embodiment there is provided a process for the production of a durable photocatalytically active coated glass which comprises depositing on the surface of a glass substrate a photocatalytically active titanium oxide layer by contacting the surface of the substrate, which is at a temperature in the range 645° C. to 720° C., preferably in the range 670° C. to 720° C. with a fluid mixture containing a source of titanium.

As noted above, the applicants have found that by depositing the titanium oxide at high temperature, a coating of relatively high photocatalytic activity for its thickness may be produced and, as coatings of reduced thickness tend to have lower reflection, the invention also provides novel products having an advantageous combination of high photocatalytic activity with moderate or low light reflection.

Thus, the present invention, in another aspect, provides a photocatalytically active coated substrate comprising a substrate having a photocatalytically active titanium oxide coating on one surface thereof, characterised in that the coated surface of the substrate has a photocatalytic activity of greater than $5 \times 10^{-3}$ cm$^{-1}$ min$^{-1}$ and in that the coated substrate has a visible light reflection measured on the coated side of 35% or lower.

High photocatalytic activity is advantageous because the amount of contaminants (including dirt) on the coated surface of the photocatalytically active coated substrate will be reduced quicker than on substrates with relatively low photocatalytic activity. Also, relatively quick removal of surface contaminants will tend to occur at low levels of UV light intensity.

Photocatalytic activity for the purposes of this specification is determined by measuring the rate of decrease of the integrated absorbance of the infra-red absorption peaks corresponding to the C—H stretches of a thin film of stearic acid, formed on the coated substrate, under illumination by UV light from a UVA lamp having an intensity of about 32 W/m$^2$ at the surface of the coated substrate and a peak wavelength of 351 nm. The stearic acid may be formed on the coated substrate by spin casting a solution of stearic acid in methanol as described below.

Preferably, the coated surface of the substrate has a photocatalytic activity of greater than $1 \times 10^{-2}$ cm$^{-1}$ min$^{-1}$, more preferably of greater than $3 \times 10^{-2}$ cm$^{-1}$ min$^{-1}$.

Low visible light reflection is advantageous because it is less distracting than high reflection and, especially for glass substrates, low visible light reflection corresponds to high visible transmission which is often required in architectural and especially automotive applications of glass.

Preferably, the coated substrate has a visible reflection measured on the coated side of 20% or lower more preferably of 17% or lower and most preferably of 15% or lower.

In most embodiments of the invention the substrate will be substantially transparent and in a preferred embodiment of the invention the substrate comprises a glass substrate. Usually the glass substrate will be a soda lime glass substrate.

Where the substrate is a soda lime glass substrate or other alkali metal ion containing substrate, the coated substrate preferably has an alkali metal ion blocking underlayer between the surface of the substrate and the photocatalytically active titanium oxide coating. This reduces the tendency for alkali metal ions from the substrate to migrate into the photocatalytically active titanium oxide coating which is advantageous because of the well known tendency of alkali metal ions to poison semiconductor oxide coatings, reducing their activity.

The alkali metal ion blocking underlayer may comprise a metal oxide but preferably the alkali metal ion blocking layer is a layer of silicon oxide. The silicon oxide may be silica but will not necessarily be stoichiometric and may comprise impurities such as carbon (often referred to as silicon oxycarbide and deposited as described in GB 2,199, 848B) or nitrogen (often referred to as silicon oxynitride).

It is advantageous if the alkali metal ion blocking underlayer is thin so that it has no significant effect on the optical properties of the coating, especially by reducing the transparency of a transparent coated substrate or causing interference colours in reflection or transmission. The suitable thickness range will depend on the properties of the material used to form the alkali metal ion blocking layer (especially its refractive index), but usually the alkali metal ion blocking underlayer has a thickness of less than 60 nm and preferably has a thickness of less than 40 nm. Where present, the alkali metal ion blocking underlayer should always be thick enough to reduce or block migration of alkali metal ions from the glass into the titanium oxide coating.

An advantage of the present invention is that the photocatalytically active titanium oxide coating is thin (contributing to the low visible reflection of the coated substrate) but the coated substrate still has excellent photocatalytic activity. Preferably, the titanium oxide coating has a thickness of 30 nm or lower, more preferably the titanium oxide coating has a thickness of 20 nm or lower and most preferably the titanium oxide coating has a thickness in the range 2 nm to about 20 nm.

The present invention is also advantageous because depositing thin titanium oxide coatings requires less precursor and the layers can be deposited in a relatively short time. A thin titanium oxide coating is also less likely to cause interference colours in reflection or transmission. However, a particular advantage is that the visible light reflection of a thin titanium oxide coating is low which is especially important when the coated substrate is coated glass. Usually the required visible light transmission of the coated glass will determine the thickness of the titanium oxide coating.

Preferably, the coated surface of the substrate has a static water contact angle of 20° or lower. Freshly prepared or cleaned glass has a hydrophilic surface (a static water contact angle of lower than about 40° indicates a hydrophilic surface), but organic contaminants rapidly adhere to the surface increasing the contact angle. A particular benefit of coated substrates (and especially coated glasses) of the present invention is that even if the coated surface is soiled, irradiation of the coated surface by UV light of the right wavelength will reduce the contact angle by reducing or destroying those contaminants. A further advantage is that water will spread out over the low contact angle surface reducing the distracting effect of droplets of water on the surface (e.g. from rain) and tending to wash away any grime or other contaminants that have not been destroyed by the photocatalytic activity of the surface. The static water contact angle is the angle subtended by the meniscus of a water droplet on a glass surface and may be determined in a known manner by measuring the diameter of a water droplet of known volume on a glass surface and calculated using an iterative procedure.

Preferably, the coated substrate has a haze of 1% or lower, which is beneficial because this allows clarity of view through a transparent coated substrate.

In preferred embodiments, the coated surface of the substrate is durable to abrasion, such that the coated surface remains photocatalytically active after it has been subjected to 300 strokes of the European standard abrasion test. Preferably, the coated surface remains photocatalytically active after it has been subjected to 500 strokes of the European standard abrasion test, and more preferably the coated surface remains photocatalytically active after it has been subjected to 1000 strokes of the European standard abrasion test.

This is advantageous because self-cleaning coated substrates of the present invention will often be used with the coated surface exposed to the outside (e.g. coated glasses with the coated surface of the glass as the outer surface of a window) where the coating is vulnerable to abrasion.

The European standard abrasion test refers to the abrasion test described in European standard BS EN 1096 Part 2 (1999) and comprises the reciprocation of a felt pad at a set speed and pressure over the surface of the sample.

In the present specification, a coated substrate is considered to remain photocatalytically active if, after being subjected to the European abrasion test, irradiation by UV light (e.g. of peak wavelength 351 nm) reduces the static water contact angle to below 15°. To achieve this contact angle after abrasion of the coated substrate will usually take less than 48 hours of irradiation at an intensity of about 32 W/m² at the surface of the coated substrate.

Preferably, the haze of the coated substrate is 2% or lower after being subjected to the European standard abrasion test.

Durable coated substrates according to the present invention may also be durable to humidity cycling (which is intended to have a similar effect to weathering). Thus, in preferred embodiments of the invention, the coated surface of the substrate is durable to humidity cycling such that the coated surface remains photocatalytically active after the coated substrate has been subjected to 200 cycles of the humidity cycling test. In the present specification, the humidity cycling test refers to a test wherein the coating is subjected to a temperature cycle of 35° C. to 75° C. to 35° C. in 4 hours at near 100% relative humidity. The coated substrate is considered to remain photocatalytically active, if, after the test, irradiation by UV light reduces the static water contact angle to below 15°.

In a further preferred embodiment, the present invention provides a durable photocatalytically active coated glass comprising a glass substrate having a coating on one surface thereof, said coating comprising an alkali metal ion blocking underlayer and a photocatalytically active titanium oxide layer, wherein the coated surface of the substrate is durable to abrasion such that the coated surface remains photocatalytically active after it has been subjected to 300 strokes of the European standard abrasion test. In this embodiment, the coated glass preferably has a visible light reflection measured on the coated side of 35% or lower, and the photocatalytically active titanium oxide layer preferably has a thickness of 30 nm or lower. Thin coatings are durable to abrasion which is surprising because previously it has been thought that only relatively thick coatings would have good durability.

In a still further embodiment, the present invention provides a coated glass comprising a glass substrate having a photocatalytically active titanium oxide coating on one surface thereof, characterised in that the coated surface of the glass has a photocatalytic activity of greater than $4 \times 10^{-2}$ $cm^{-1}$ $min^{-1}$, preferably greater than $6 \times 10^{-2}$ $cm^{-1}$ $min^{-1}$ and more preferably greater than $8 \times 10^{-2}$ $cm^{-1}$ $min^{-1}$ and in that the coated glass has a visible light reflection measured on the coated side of less than 20%.

Coated substrates according to the present invention have uses in many areas, for example as glazings in windows including in a multiple glazing unit comprising a first glazing pane of a coated substrate in spaced opposed relationship to a second glazing pane, or, when the coated substrate is coated glass, as laminated glass comprising a first glass ply of the coated glass, a polymer interlayer (of, for example, polyvinylbutyral) and a second glass ply.

In addition to uses in self-cleaning substrates (especially self-cleaning glass for windows), coated substrates of the present invention may also be useful in reducing the concentration of atmospheric contaminants. For example, coated glass under irradiation by light of UV wavelengths (including UV wavelengths present in sunlight) may destroy atmospheric contaminants for example, nitrogen oxides, ozone and organic pollutants, adsorbed on the coated surface of the glass. This use is particularly advantageous in the open in built-up areas (for example, in city streets) where the concentration of organic contaminants may be relatively high (especially in intense sunlight), but where the available surface area of glass is also relatively high. Alternatively, the coated glass (with the coated surface on the inside) may be used to reduce the concentration of atmospheric contaminants inside buildings, especially in office buildings having a relatively high concentration of atmospheric contaminants.

The invention is illustrated but not limited by the following drawings.

BRIEF DESCRIPTION OF THE DRAWINGS

FIG. 2 illustrates apparatus for on line chemical vapour deposition of coatings according to the invention.

DETAILED DESCRIPTION OF THE PREFERRED EMBODIMENTS

Figure 1:
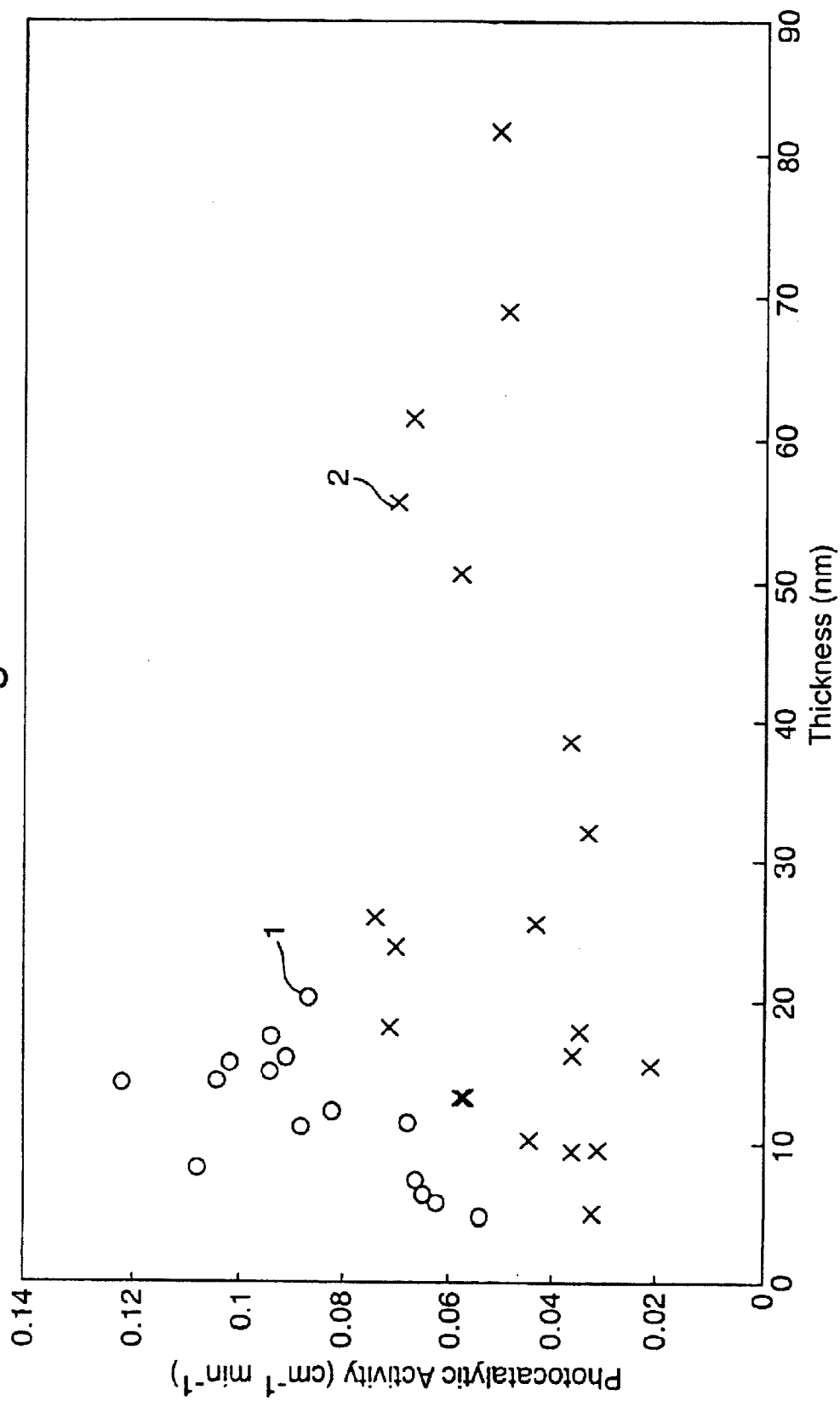
FIG. 1 is a graph of photocatalytic activity of coated glass produced by a process according to the invention as a function of the thickness of the titanium oxide layer.

In FIG. 1 the coated glasses were produced using an on-line CVD process as described in the Examples, below. The open circles 1 relate to titanium oxide layers deposited using titanium tetrachloride as titanium precursor, and the crosses 2 relate to titanium oxide layers deposited using titanium tetraethoxide as titanium precursor.

The layers of the coating may be applied on line onto the glass substrate by chemical vapour deposition during the glass manufacturing process. FIG. 2 illustrates an apparatus, indicated generally at 10, useful for the on line production of the coated glass article of the present invention, comprising a float section 11, a lehr 12, and a cooling section 13. The float section 11 has a bottom 14 which contains a molten tin bath 15, a roof 16, sidewalls (not shown), and end walls 17, which together form a seal such that there is provided an enclosed zone 18, wherein a non-oxidising atmosphere is maintained to prevent oxidation of the tin bath 15. During operation of the apparatus 10, molten glass 19 is cast onto a hearth 20, and flows therefrom under a metering wall 21, then downwardly onto the surface of the tin bath 15, forming a float glass ribbon 37, which is removed by lift-out rolls 22 and conveyed through the lehr 12, and thereafter through the cooling section 13.

A non-oxidising atmosphere is maintained in the float section 11 by introducing a suitable gas, such as for example one comprising nitrogen and 2% by volume hydrogen, into the zone 18, through conduits 23 which are operably connected to a manifold 24. The non-oxidizing gas is introduced into the zone 18 from the conduits 23 at a rate sufficient to compensate for losses of the gas (some of the non-oxidizing atmosphere leaves the zone 18 by flowing under the end walls 17), and to maintain a slight positive pressure above ambient pressure. The tin bath 15 and the enclosed zone 18 are heated by radiant heat directed downwardly from heaters 25. The heat zone 18 is generally maintained at a temperature of about 1330° F. to 1400° F. (721° C. to 760° C.). The atmosphere in the lehr 12 is typically air, and the cooling section 13 is not enclosed. Ambient air is blown onto the glass by fans 26.

The apparatus 10 also includes coaters 27, 28, 29 and 30 located in series in the float zone 11 above the float glass ribbon 37. The precursor gaseous mixtures for the individual layers of the coating are supplied to the respective coaters, which in turn direct the precursor gaseous mixtures to the hot surface of the float glass ribbon 37. The temperature of the float glass ribbon 37 is highest at the location of the coater 27 nearest the hearth 20 and lowest at the location of the coater 30 nearest the lehr 12.

The invention is further illustrated by the following Examples, in which coatings were applied by laminar flow chemical vapour deposition in the float bath on to a moving ribbon of float glass during the glass production process. In the Examples two layer coatings were applied to the glass ribbon.

All gas volumes are measured at standard temperature and pressure unless otherwise stated. The thickness values quoted for the layers were determined using high resolution scanning electron microscopy and optical modelling of the reflection and transmission spectra of the coated glass. Thickness of the coatings was measured with an uncertainty of about 5%. The transmission and reflection properties of the coated glasses were determined using an Hitachi U-4000 spectrophotometer. The a, b and L* values mentioned herein of the transmission and/or reflection colour of the glasses refer to the CIE Lab colours. The visible reflection and visible transmission of the coated glasses were determined using the D65 illuminant and the standard CIE 2° observer in accordance with the ISO 9050 standard (Parry Moon airmass 2) The haze of the coated glasses was measured using a WYK–Gardner Hazeguard+haze meter.

The photocatalytic activity of the coated glasses was determined from the rate of decrease of the area of the infrared peaks corresponding to C—H stretches of a stearic acid film on the coated surface of the glass under illumination by UVA light. The stearic acid film was formed on samples of the glasses, 7–8 cm square, by spin casting 20 $\mu l$ of a solution of stearic acid in methanol ($8.8\times10^{-3}$ mol $dm^{-3}$) on the coated surface of the glass at 2000 rpm for 1 minute. Infra red spectra were measured in transmission, and the peak height of the peak corresponding to the C—H stretches (at about 2700 to 3000 $cm^{-1}$) of the stearic acid film was measured and the corresponding peak area determined from a calibration curve of peak area against peak height. The coated side of the glass was illuminated with a UVA-351 lamp (obtained from the Q-Panel Co., Cleveland, Ohio, USA) having a peak wavelength of 351 nm and an intensity at the surface of the coated glass of approximately 32 W/$m^2$. The photocatalytic activity is expressed in this specification either as the rate of decrease of the area of the IR peaks (in units of $cm^{-1}$ $min^{-1}$) or as $t_{90\%}$ (in units of min) which is the time of UV exposure taken to reduce the peak height (absorption) of a peak in the wavelength area down to 10% of its initial value.

The static water contact angle of the coated glasses was determined by measuring the diameter of a water droplet (volume in the range 1 to 5 $\mu l$) placed on the surface of the coated glass after irradiation of the coated glass using the UVA 351 lamp for about 2 hours (or as otherwise specified).

EXAMPLES 1–15

A ribbon of 1 mm thick soda lime float glass advancing at a lehr speed of 300 m/hour was coated with a two-layer coating as the ribbon advanced over the float bath at a position where the glass temperature was in the range of about 650° C. to about 670° C. The float bath atmosphere comprised a flowing gaseous mixture of nitrogen and 9% hydrogen at a bath pressure of approximately 0.15 mbar.

Layer 1 (the first layer to be deposited on the glass) was a layer of silicon oxide. Layer 1 was deposited by causing a gaseous mixture of monosilane ($SiH_4$, 60 ml/min), oxygen (120 ml/min), ethylene (360 ml/min) and nitrogen (8 litres/min) to contact and flow parallel to the glass surface in the direction of movement of the glass using coating apparatus as described in GB patent specification 1 507 966 (referring in particular to FIG. 2 and the corresponding description on page 3 line 73 to page 4 line 75) with a path of travel of the gaseous mixture over the glass surface of approximately 0.15 m. Extraction was at approximately 0.9 to 1.2 mbar. The glass ribbon was coated across a width of approximately 10 cm at a point where its temperature was approximately 670° C. The thickness of the silica layer was about 20 to 25 m.

Layer 2 (the second layer to be deposited) was a layer of titanium dioxide. Layer 2 was deposited by combining separate gas streams comprising titanium tetrachloride in flowing nitrogen carrier gas, ethyl acetate in flowing nitrogen carrier gas and a bulk flow of nitrogen of 8 l/min (flow rate measured at 20 psi) into a gaseous mixture and then delivering (through lines maintained at about 250° C.) the gaseous mixture to coating apparatus consisting of an oil cooled dual flow coater. The pressure of the nitrogen carrier and bulk nitrogen gases was approximately 20 pounds per square inch. The gaseous mixture contacted and flowed parallel to the glass surface both upstream and downstream along the glass ribbon. The path of travel of the gaseous mixture downstream was about 0.15 m and upstream was about 0.15 m with extraction of about 0.15 mbar. Titanium tetrachloride and ethyl acetate were entrained in separate streams of flowing nitrogen carrier gas by passing nitrogen through bubblers containing either titanium tetrachloride or ethyl acetate. The flow rates of the nitrogen carrier gases are described in Table 1 (the flow rates were measured at 20 psi). The titanium tetrachloride bubbler was maintained at a temperature of 69° C. and the ethyl acetate bubbler was maintained at a temperature of 42° C. The estimated flow rates of entrained titanium tetrachloride and entrained ethyl acetate are also described in Table 1 for each of the Examples 1 to 15.

The properties of the two-layer coatings were measured. Values of the thickness of layer 2 (the titanium oxide layer), and values of the visible reflection measured on the coated side, L* and haze of the coated glasses are described in Table 2 for the Examples 1–15. The haze of each coated glass was below 0.2%.

The photocatalytic activity and static water contact angle of the coated glasses were determined. The initial peak height and initial peak area of the IR peaks corresponding to the stearic acid C—H stretches, the photocatalytic activity, the static water contact angle and $t_{90\%}$ for the Examples 1–15 are described in Table 3. The thickness of the titanium oxide layer, surprisingly has little effect on photocatalytic activity.

EXAMPLES 16–19

Examples 16–19 were conducted under the same conditions as Examples 1–15 except that the bath pressure was approximately 0.11 mbar, extraction for deposition of the silica undercoat (layer 1) was approximately 0.7 mbar, the titanium tetrachloride bubbler was maintained at a temperature of approximately 100° C., the ethyl acetate bubbler was maintained at a temperature of approximately 45° C. and the delivery lines were maintained at a temperature of approximately 220° C.

The flow rates of nitrogen carrier gas, and the estimated flow rates of entrained titanium tetrachloride and entrained ethyl acetate are disclosed for each of the examples 16–19 in Table 1.

Values of the estimated thickness of layer 2 (the titanium oxide layer), and values of visible reflection measured on the coated side, L* and haze of the coated glasses are described in Table 2 for each of the Examples 16–19.

The initial peak height and initial peak area of the IR peaks corresponding to the stearic acid C—H stretches, the photocatalytic activity, $t_{90\%}$ and the static water contact angle and for each of the Examples 16–19 are described in Table 3.

The photocatalytic activity of the Examples 16–19 was not substantially greater than that of the Examples 1–15 despite the thicker titanium oxide (and hence more reflective) coatings.

TABLE 1

| | Nitrogen Carrier Gas Flow Rates to Bubblers (l/min, measured at 20 psi) | | $TiCl_4$ | Ethyl Acetate |
|---|---|---|---|---|
| Example | $TiCl_4$ Bubbler | Ethyl Acetate Bubbler | flow rate (l/min) | flow rate (l/min) |
| 1 | 0.16 | 1 | 0.032 | 0.46 |
| 2 | 0.12 | 0.3 | 0.024 | 0.14 |
| 3 | 0.12 | 0.45 | 0.024 | 0.21 |
| 4 | 0.08 | 0.2 | 0.016 | 0.09 |
| 5 | 0.12 | 0.15 | 0.024 | 0.07 |
| 6 | 0.12 | 0.75 | 0.024 | 0.35 |
| 7 | 0.08 | 0.3 | 0.016 | 0.14 |
| 8 | 0.08 | 0.5 | 0.016 | 0.23 |
| 9 | 0.04 | 0.1 | 0.008 | 0.05 |
| 10 | 0.04 | 0.15 | 0.008 | 0.07 |
| 11 | 0.04 | 0.25 | 0.008 | 0.12 |
| 12 | 0.16 | 0.1 | 0.032 | 0.05 |
| 13 | 0.08 | 0.1 | 0.016 | 0.05 |
| 14 | 0.16 | 0.4 | 0.032 | 0.19 |

TABLE 1-continued

| | Nitrogen Carrier Gas Flow Rates to Bubblers (l/min, measured at 20 psi) | | $TiCl_4$ | Ethyl Acetate |
|---|---|---|---|---|
| Example | $TiCl_4$ Bubbler | Ethyl Acetate Bubbler | flow rate (l/min) | flow rate (l/min) |
| 15 | 0.16 | 0.2 | 0.032 | 0.09 |
| 16 | 0.1 | 0.5 | 0.088 | 0.27 |
| 17 | 0.08 | 0.4 | 0.070 | 0.22 |
| 18 | 0.06 | 0.3 | 0.053 | 0.16 |
| 19 | 0.04 | 0.2 | 0.035 | 0.11 |

TABLE 2

| Example | Thickness of titanium oxide layer (nm) | Visible reflection of coated glass (%) | L* value of coated glass (%) | Haze (%) |
|---|---|---|---|---|
| 1 | 15 | 14.1 | 44 | 0.12 |
| 2 | 14.3 | 13.9 | 44 | 0.07 |
| 3 | 14.2 | 13.2 | 43 | 0.12 |
| 4 | 11.3 | 11.4 | 40 | 0.08 |
| 5 | 12.1 | 12.1 | 41 | 0.08 |
| 6 | 11.0 | a | a | 0.07 |
| 7 | 8 | a | a | 0.11 |
| 8 | 7.2 | 9.7 | 37 | 0.04 |
| 9 | 6.1 | 9.1 | 36 | 0.05 |
| 10 | 5.6 | 9 | 36 | 0.07 |
| 11 | 4.6 | 8.7 | 35 | 0.06 |
| 12 | 15.6 | 15.4 | 46 | 0.1 |
| 13 | 16.0 | a | a | 0.13 |
| 14 | 17.5 | 16.2 | 47 | 0.14 |
| 15 | 20.3 | 19.5 | 51 | 0.1 |
| 16 | a | 28.4 | 47.8 | 0.3 |
| 17 | ca 68 | 29.1 | 58.4 | 0.37 |
| 18 | ca 32 | 25.9 | 55.6 | 0.24 |
| 19 | ca 27 | 20.5 | 50.2 | 0.2 | a not measured

TABLE 3

| | IR Peaks corresponding to stearic acid film C–H stretches (2700–3000 $cm^{-1}$) | | Photo-catalytic Activity ($\times 10^{-2}$ $cm^{-1}$ $min^{-1}$) | Static Water Contact Angle (°) | $t_{90\%}$ (min) |
|---|---|---|---|---|---|
| Example | Initial Peak Height (arbitrary units) | Initial Peak Area ($cm^{-1}$) | | | |
| 1 | 0.030 | 1.04 | 9.4 | 17 ± 5 | 10 |
| 2 | 0.0331 | 1.15 | 10.4 | 15 ± 1 | 10 |
| 3 | 0.0311 | 1.08 | 12.2 | 13 ± 2 | 8 |
| 4 | 0.0324 | 1.13 | 6.8 | 14 ± 1 | 15 |
| 5 | 0.0287 | 1.00 | 8.2 | 16 ± 3 | 11 |
| 6 | 0.028 | 0.98 | 8.8 | 15 ± 1 | 10 |
| 7 | 0.0343 | 1.20 | 10.8 | 15 ± 1 | 10 |
| 8 | 0.0289 | 1.03 | 6.6 | 16 ± 1 | 14 |
| 9 | 0.0289 | 1.01 | 6.5 | 14 ± 2 | 14 |
| 10 | 0.0278 | 0.97 | 6.2 | 18 ± 2 | 14 |
| 11 | 0.0344 | 1.20 | 5.4 | 18 ± 1 | 20 |
| 12 | 0.0291 | 1.02 | 10.2 | 12 ± 1 | 9 |
| 13 | 0.0289 | 1.01 | 9.1 | 14 ± 2 | 10 |
| 14 | 0.0269 | 0.94 | 9.4 | 15 ± 2 | 9 |
| 15 | 0.0331 | 1.15 | 8.7 | 15 ± 2 | 12 |
| 16 | 0.0227 | 0.79 | 17.8 | 12 | 4 |
| 17 | 0.026 | 0.91 | 10.2 | 12 | 8 |
| 18 | 0.0225 | 0.79 | 10.1 | 13 | 7 |
| 19 | 0.0258 | 0.90 | 10.1 | 16 | 8 |

EXAMPLES 20–27

The Examples 20–27 were conducted under the same conditions as Examples 1–15 except that layer 2 was deposited from a gaseous mixture comprising titanium tetraethoxide entrained in nitrogen carrier gas by passing the carrier gas through a bubbler containing titanium tetraethoxide maintained at a temperature of 170° C. The flow rates of nitrogen carrier gas (measured at 20 psi) and titanium tetraethoxide are described in Table 4 for each of the Examples 20–27. The flow rate of bulk nitrogen gas was 8.5 l/min (measured at 20 psi).

The properties of the two-layer coatings were measured. Values of the thickness of layer 2 (the titanium oxide layer), and values of the visible reflection measured on the coated side and haze of the coated glasses are described in Table 5 for the Examples 20–27. The haze of each coated glass was below 0.7%.

The photocatalytic activity and static water contact angle of the coated glasses were determined. The initial peak height and initial peak area of the IR peaks corresponding to the stearic acid C—H stretches, the photocatalytic activity and $t_{90\%}$, and the static water contact angle for each of the Examples 20–27 are described in Table 6.

EXAMPLES 28 AND 29

The Examples 28 and 29 were conducted under the same conditions as Examples 20–27 except that the titanium tetraethoxide bubbler was maintained at a temperature of 168° C. and the bath pressure was 0.11 mbar. Data relating to Examples 28–29 equivalent to data for Examples 20–27 are described in Tables 4, 5 and 6.

TABLE 4

| Example | Nitrogen Carrier Gas Flow Rates to Titanium tetraethoxide bubbler (l/min, measured at 20 psi) | Titanium ethoxide flow rate (l/min) |
| --- | --- | --- |
| 20 | 0.25 | 0.014 |
| 21 | 0.15 | 0.008 |
| 22 | 0.2 | 0.011 |
| 23 | 0.25 | 0.014 |
| 24 | 0.3 | 0.017 |
| 25 | 0.35 | 0.019 |
| 26 | 0.2 | 0.011 |
| 27 | 0.1 | 0.006 |
| 28 | 0.6 | 0.030 |
| 29 | 0.4 | 0.020 |

TABLE 5

| Example | Thickness of titanium oxide layer (nm) | Visible reflection of coated glass (%) | Haze (%) |
| --- | --- | --- | --- |
| 20 | 13 | a | 0.4 |
| 21 | 13 | a | 0.29 |
| 22 | 16 | 15.7 | 0.29 |
| 23 | 18 | a | 0.28 |
| 24 | 24 | a | a |
| 25 | 26 | a | 0.61 |
| 26 | 9.9 | 10.9 | 0.19 |
| 27 | 4.7 | 8.8 | 0.29 |
| 28 | 38.3 | 35.2 | 0.29 |
| 29 | 31.9 | 28.4 | 0.22 | a Not measured

TABLE 6

| | IR Peaks corresponding to stearic acid film C–H stretches (2700–3000 cm$^{-1}$) | | Photo-catalytic Activity ($\times 10^{-2}$ cm$^{-1}$ min$^{-1}$) | Static Water Contact Angle (°) | $t_{90\%}$ (min) |
| --- | --- | --- | --- | --- | --- |
| Example | Initial Peak Height (arbitrary units) | Initial Peak Area (cm$^{-1}$) | | | |
| 20 | 0.027 | 0.953 | 5.7 | 19 ± 5 | 15 |
| 21 | 0.031 | 1.095 | 5.7 | a | 17 |
| 22 | 0.024 | 0.838 | 3.6 | 15 ± 2 | 21 |
| 23 | 0.030 | 1.029 | 7.1 | 11 ± 3 | 13 |
| 24 | 0.029 | 1.015 | 7 | 17 ± 3 | 13 |
| 25 | 0.031 | 1.071 | 7.4 | 13 ± 4 | 13 |
| 26 | 0.031 | 1.085 | 4.4 | 21 ± 3 | 22 |
| 27 | 0.029 | 0.998 | 3.2 | 16 ± 5 | 28 |
| 28 | 0.021 | 0.733 | 3.6 | 13 | 18 |
| 29 | 0.024 | 0.848 | 3.3 | 14 | 23 | a Not measured

EXAMPLES 30–42

In Examples 30 to 42, two-layer coatings were applied by on line CVD to a float glass ribbon across its full width of approximately 132 inches (3.35 m) in the float bath during the float glass production process. The apparatus used to deposit the coating is illustrated in FIG. 2. The float bath atmosphere comprised nitrogen and 2% by volume hydrogen. Bath pressure was 0.15 mbar.

The two layer coating consisted of a silicon oxide layer deposited first on the float glass ribbon and titanium oxide layer deposited on to the silicon oxide layer. The precursor chemistry of the gaseous mixtures used to deposit the coating was the same as that used in Examples 1–15. The temperature of deposition of the layers was varied by using different coaters 27, 28, 29 or 30 (referring to FIG. 2). Coater 27 located nearest the hearth being hottest and coater 30 located nearest the lehr being coolest. In Examples 30–33 and 42 two coaters (28 and 29 in Examples 30–33 and coaters 27 and 28 in Example 42) were used to deposit the silicon oxide coating. The benefit of using two coaters to deposit the silicon oxide layer is that longer production run times are possible.

The gaseous mixture used to deposit the silicon oxide layer for Examples 30 to 41 consisted of the following gases at the following flow rates: helium (250 l/min), nitrogen (285 l/min), monosilane (2.5 l/min), ethylene (15 l/min) and oxygen (10 l/min). For Example 42, the same gases and flow rates were used except for monosilane (2.3 l/min), ethylene (13.8 l/min) and oxygen (9.2 l/min). Where two coaters were used to deposit the silicon oxide layer in Examples 30 to 42, the above flow rates were used for each coater.

In Examples 30–42 the deposition temperatures (i.e. the temperature of the float glass ribbon under the coater corresponding to each of the coaters 27–30) was as indicated in Table 7. The temperatures in Table 7 have an uncertainty of about ±50° F. (±28° C.). The extraction for each coater was at approximately 2 mbar.

TABLE 7

| Coater | Approx. Temperature of Glass Ribbon |
|---|---|
| 27 | 1330° F. (721° C.) |
| 28 | 1275° F. (690° C.) |
| 29 | 1250° F. (677° C.) |
| 30 | 1150° F. (621° C.) |

Titanium tetrachloride (TiCl$_4$) and ethyl acetate were entrained in separate nitrogen/helium carrier gas streams. For the evaporation of TiCl$_4$ a thin film evaporator was used. The liquid TiCl$_4$ was held in a pressurised container (head pressure approx 5 psi). This was used to deliver the liquid to a metering pump and Coriolis force flow measurement system. The metered flow of the precursor was then fed into a thin film evaporator at a temperature of 110° F. (43° C.). The TiCl$_4$ was then entrained in the carrier gas (helium) and delivered to the mixing point down lines held at 250° F. (121° C.). The ethyl acetate was delivered in a similar way. The liquid ethyl acetate was held in a pressurised container (head pressure approx 5 psi). This was used to deliver the liquid to a metering pump and Coriolis force flow measurement system. The metered flow of the precursor was then fed into a thin film evaporator at a temperature of 268° F. (131° C.). The evaporated ethyl acetate was then entrained in the carrier gas (helium/nitrogen mixture) and delivered to the mixing point down lines held at approximately 250° F. (121° C.).

The TiCl$_4$ and ethyl acetate gas streams were combined to form the gaseous mixture used to deposit the titanium oxide layer. This mixing point was just prior to the coater.

The line speed of the float glass ribbon, the temperature of deposition of the silicon oxide and temperature of deposition of the titanium oxide layers and the flow rates of the He/N$_2$ bulk carrier gas and the flow rate of TiCl$_4$ and ethyl acetate are described for Examples 30–42 in Table 8.

The coated float glass ribbon was cooled and cut and the optical properties and photocatalytic activity of samples determined. Table 9 describes the haze, optical properties in transmission and reflection (visible percent transmission/reflection and colour co-ordinates using the LAB system) of the samples. The coated glasses were subjected to abrasion testing in accordance with BS EN 1096, in which a sample of size 300 mm×300 mm is fixed rigidly, at the four corners, to the test bed ensuring that no movement of the sample is possible. An unused felt pad cut to the dimensions stated in the standard (BS EN 1096 Part 2 (1999)) is then mounted in the test finger and the finger lowered to the glass surface. A load pressure on the test finger of 4N is then set and the test started. The finger is allowed to reciprocate across the sample for 500 strokes at a speed of 60 strokes/min ±6 strokes/min. Upon completion of this abrasion the sample is removed and inspected optically and in terms of photocatalytic activity. The sample is deemed to have passed the test if the abrasion results in a change in transmission of no more than ±5% when measured at 550 nm and the coated substrate remains photocatalytically active which means that, after the test irradiation by UV light for 2 hours reduces the static water contact angle to below 15°.

The glasses were also subjected to a humidity cycling test in which the coating is subjected to a temperature cycle of 35° C. to 75° C. to 35° C. in 4 hours at near 100% relative humidity.

The static water contact angle of the coated glasses as produced and after 130 minutes of UV irradiation (UVA 351 mm lamp at approximately 32 W/m$^2$) and after 300, 500 and/or 1000 strokes of the European standard abrasion test described in Table 10. The contact angle of the abraded samples was determined after irradiation for 2 hours.

The samples deposited at the higher temperatures of 1330–1250° F. (721° C. to 677° C.) were photocatalytically active even after 1000 European standard abrasion strokes or after 200 humidity cycles. The photocatalytic activity in terms of t$_{90\%}$ of the coated glasses as produced and after 300, 500 and/or 1000 strokes of the European standard abrasion test and after 200 humidity testing cycles are described in Table 11. In Table 11, the term Active indicates that the coated glasses were photocatalytically active but that t$_{90\%}$ was not determined.

TABLE 8

| | | | | Titanium Oxide Layer | | | |
|---|---|---|---|---|---|---|---|
| | Line- | Silica layer | | Flow Rates of | | Flow Rates of Precursors | |
| | Speed | Deposition | Deposition | Carrier Gases | | TiCl$_4$ | Ethyl Acetate |
| Example | (m/min) | Temperature/° C. | Temperature/° C. | He L/min | N$_2$ L/min | cc/min | cc/min |
| 30 | 10.9 | 690 & 677 | 621 | 300 | 300 | 6.3 | 16.3 |
| 31 | 10.9 | 690 & 677 | 621 | 300 | 300 | 6.3 | 16.3 |
| 32 | 10.9 | 690 & 677 | 621 | 300 | 300 | 6.3 | 16.3 |
| 33 | 10.9 | 690 & 677 | 621 | 300 | 300 | 6.3 | 16.3 |
| 34 | 10.9 | 690 | 621 | 300 | 300 | 6 | 16 |
| 35 | 10.9 | 690 | 621 | 300 | 300 | 6 | 16 |
| 36 | 10.9 | 690 | 621 | 300 | 300 | 6 | 16 |
| 37 | 10.9 | 690 | 677 | 300 | 300 | 5.5 | 14.7 |
| 38 | 10.9 | 690 | 677 | 300 | 300 | 5.5 | 14.7 |
| 39 | 10.9 | 690 | 677 | 300 | 300 | 5.5 | 14.7 |
| 40 | 10.9 | 690 | 677 | 300 | 300 | 5.5 | 14.7 |

TABLE 8-continued

| | | Silica layer | Titanium Oxide Layer | | | | |
|---|---|---|---|---|---|---|---|
| | Line- | | | Flow Rates of | | Flow Rates of Precursors | |
| | Speed | Deposition | Deposition | Carrier Gases | | TiCl$_4$ | Ethyl Acetate |
| Example | (m/min) | Temperature/° C. | Temperature/° C. | He L/min | N$_2$ L/min | cc/min | cc/min |
| 41 | 6.5 | 721 | 690 | 300 | 300 | 4 | 10.7 |
| 42 | 12.1 | 721 & 690 | 677 | 300 | 300 | 9.5 | 25.4 |

TABLE 9

| | Film Side Reflection | | | | Transmission | | | | Haze |
|---|---|---|---|---|---|---|---|---|---|
| Example | R (%) | L* | a | b | T (%) | L* | a | b | (%) |
| 30 | 14.2 | 44.5 | 0.3 | −10.3 | 84.3 | 93.6 | −1.2 | 3.6 | 0.11 |
| 31 | 14.6 | 45.1 | 0.3 | −10.4 | 84.5 | 93.7 | −1.1 | 3.4 | 0.30 |
| 32 | 14.6 | 45.1 | 0.3 | −10.5 | 84.3 | 93.6 | −1.1 | 3.6 | 0.12 |
| 33 | 13.8 | 44.0 | 0.3 | −9.8 | 85.5 | 94.1 | −1.1 | 2.9 | 0.15 |
| 34 | 13.6 | 43.7 | 0.1 | −8.7 | 84.8 | 93.8 | −1.1 | 2.7 | 0.12 |
| 35 | 13.8 | 43.9 | 0.1 | −8.8 | 85.4 | 94.1 | −1.1 | 2.6 | 0.11 |
| 36 | 12.9 | 42.6 | 0.1 | −8.2 | 85.8 | 94.2 | −1.1 | 2.5 | 0.14 |
| 37 | 12.6 | 42.2 | 0.1 | −7.9 | 86.1 | 94.4 | −1.1 | 2.3 | 0.08 |
| 38 | 11.9 | 41.0 | 0.1 | −6.9 | 87.1 | 94.8 | −1.1 | 1.7 | 0.07 |
| 39 | 11.5 | 40.4 | 0.0 | −6.5 | 87.2 | 94.8 | −1.1 | 1.8 | 0.10 |
| 40 | 11.6 | 40.6 | 0.0 | −6.6 | 86.9 | 94.7 | −1.1 | 1.8 | 0.08 |
| 41 | a | a | a | a | a | a | a | a | a |
| 42 | 14 | 44.3 | 0.1 | −9.9 | 84.8 | 93.8 | −1.1 | 3.1 | 0.14 | a Not Measured

TABLE 10

| | Static Water Contact Angle (°) after Number of Abrasion Strokes | | | | |
|---|---|---|---|---|---|
| Example | 0 | 0 (after irradiation 130 min UV) | 300 | 500 | 1000 |
| 30 | 2.3 | 3.3 | failed | | |
| 31 | 2.0 | 3.2 | failed | | |
| 32 | a | a | failed | | |
| 33 | 2.0 | 3.2 | failed | | |
| 34 | a | a | failed | | |
| 35 | 2.0 | 3.2 | failed | | |
| 36 | 2.1 | 3.4 | failed | | |
| 37 | 2.2 | 3.3 | | <15 | |
| 38 | 2.0 | 3.1 | | <15 | |
| 39 | 1.9 | 3.1 | | <15 | |
| 40 | 2.2 | 3.2 | | <15 | |
| 41 | 7.8 | 7.8 | | | 10.1 |
| 42 | 4.7–5.3 | 4.7–5.3 | | | 5.6–9.8 | a Not measured

TABLE 11

| | t$_{90\%}$ (min) after Number of Abrasion Strokes | | | | t$_{90\%}$ (min) after |
|---|---|---|---|---|---|
| Example | 0 | 300 | 500 | 1000 | 200 Humidity Cycles |
| 30 | 7.5 | failed | | | failed |
| 31 | 18.5 | failed | | | failed |
| 32 | 8.5 | failed | | | failed |
| 33 | 8 | failed | | | failed |
| 34 | 21 | failed | | | failed |
| 35 | 4 | failed | | | failed |
| 36 | 8.5 | failed | | | failed |
| 37 | 15.5 | | Ca. 2160 | | Active |
| 38 | 18.5 | | Ca. 2160 | | Active |
| 39 | 17 | | Ca. 2160 | | Active |
| 40 | 18.5 | | Ca. 2160 | | Active |
| 41 | a | | | ca. 2160 | Active |
| 42 | 45 | | | 2800 | Active | a Not measured

What is claimed is:

1. A process for the production of a durable photocatalytically active coated glass which comprises depositing a photocatalytically active titanium oxide layer on the surface of a glass ribbon formed during a float glass production process, said layer having a thickness of 30 nm or less and a photoactivity of greater than $5 \times 10^{-3}$ cm$^{-1}$ min$^{-1}$, by contacting the surface of the ribbon with a gaseous mixture comprising a source of titanium while the ribbon is at a temperature of from 625° to 720° C.

2. A process as claimed in claim 1 wherein the ribbon is at a temperature in the range 670° C. to 720° C.

3. A process as claimed in claim 1 wherein the gaseous mixture comprises titanium tetraethoxide as the source of titanium.

4. A process as claimed in claim 1 wherein the gaseous mixture comprises titanium chloride as the source of titanium and an ester other than a methyl ester.

5. A process as claimed in claim 4 wherein the ester comprises an alkyl ester having an alkyl group with a β hydrogen.

6. A process as claimed in claim 4 wherein the ester comprises a carboxylate ester.

7. A process as claimed in claim 4 wherein the ester is an alkyl ester having a C$_2$ to C$_4$ alkyl group.

8. A process as claimed in claim 7 wherein the ester comprises an ethyl ester.

9. A process as claimed in claim 8 wherein the ester comprises ethyl acetate.

10. A process as claimed in claimed in claim 4 wherein the ester is the only source of oxygen in the fluid mixture.

11. A process as claimed in claim 1 wherein the process is performed at substantially atmospheric pressure.

* * * * *

UNITED STATES PATENT AND TRADEMARK OFFICE
CERTIFICATE OF CORRECTION

PATENT NO.    : 6,840,061 B1
DATED         : January 11, 2005
INVENTOR(S)   : Hurst et al.

It is certified that error appears in the above-identified patent and that said Letters Patent is hereby corrected as shown below:

Column 16,
Line 60, delete the second occurrence of the phrase "claimed in".

Signed and Sealed this

Seventeenth Day of May, 2005

JON W. DUDAS
*Director of the United States Patent and Trademark Office*